(12) United States Patent
Kim et al.

(10) Patent No.: US 8,053,881 B2
(45) Date of Patent: Nov. 8, 2011

(54) SEMICONDUCTOR PACKAGE AND METHOD FOR MANUFACTURING THE SAME

(75) Inventors: Young Lyong Kim, Seongnam-si (KR); Jongho Lee, Hwaseong-si (KR); Cheul-Joong Youn, Seoul (KR); Eunchul Ahn, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 131 days.

(21) Appl. No.: 12/586,565

(22) Filed: Sep. 24, 2009

(65) Prior Publication Data

US 2010/0072593 A1    Mar. 25, 2010

(30) Foreign Application Priority Data

Sep. 24, 2008  (KR) .................. 10-2008-0093773

(51) Int. Cl.
*H01L 23/02* (2006.01)

(52) U.S. Cl. ............ 257/686; 257/E23.196; 257/777
(58) Field of Classification Search .......... 257/685–686, 257/777–784, E23.196
See application file for complete search history.

(56) References Cited

U.S. PATENT DOCUMENTS

| | | | |
|---|---|---|---|
| 7,298,033 B2 | 11/2007 | Yoo | |
| 2004/0113275 A1* | 6/2004 | Karnezos | 257/758 |
| 2004/0262734 A1 | 12/2004 | Yoo | |
| 2006/0244157 A1 | 11/2006 | Carson | |
| 2008/0042253 A1 | 2/2008 | Yoo | |
| 2010/0033941 A1* | 2/2010 | Pagaila et al. | 361/809 |

FOREIGN PATENT DOCUMENTS

| | | |
|---|---|---|
| JP | 2005-26680 | 1/2005 |
| KR | 10-2005-0027384 A | 3/2005 |
| KR | 10-0604821 | 7/2006 |

* cited by examiner

*Primary Examiner* — Hoa B Trinh
(74) *Attorney, Agent, or Firm* — Onello & Mello LLP

(57) ABSTRACT

A semiconductor package includes a first package including at least one first semiconductor chip; a second package including an external connection terminal and at least one second semiconductor chip, the second package being stacked on the first package; and an interposer disposed between the first and second packages and connected to the external connection terminal to electrically connect the first and second packages to each other. The interposer comprises an intermediate connector having an exposed end portion to which the second package is electrically connected via the external connection terminal and a protruding end portion lower than the exposed end portion to which the first package is electrically connected.

5 Claims, 21 Drawing Sheets

(I)

(II)

(III)

(I)

(II)

(III)

SEMICONDUCTOR PACKAGE AND METHOD FOR MANUFACTURING THE SAME

CROSS-REFERENCE TO RELATED APPLICATION

This U.S. non-provisional patent application claims priority under 35 U.S.C §119 to Korean Patent Application No. 10-2008-0093773, filed in the Korean Intellectual Property Office on Sep. 24, 2008, the entirety of which is herein incorporated by reference.

BACKGROUND

1. Technical Field

The present invention relates to semiconductor packages and methods for manufacturing the same. More specifically, the present invention is directed to a package-on-package (PoP) type semiconductor package and a method for manufacturing the same.

2. Description of Related Art

In the semiconductor industry, there is an increasing demand for high-capacity, compact, and small semiconductor devices and electronic products using the devices. A variety of packaging technologies are being developed to meet the demand. One of these packaging technologies is a configuration in which various types of semiconductor chips are vertically stacked to achieve high-density chip stacking. According to this packaging technology, semiconductor chips having various functions are integrated into a smaller area than a typical one-chip package.

Unfortunately, the packaging technology of stacking a plurality of semiconductor chips suffers from relatively higher probability of decreased yield than a one-chip packaging technology. Package-on-package (PoP) technology is suggested to overcome yield drop and achieve high-density chip stacking. Since semiconductor packages for use in the POP technology are determined to be acceptable through tests, a defect rate may drop in end products. In this regard, there is a need for developed or improved PoP technology to increase yield and achieve high density.

SUMMARY

In one aspect, exemplary embodiments of the present invention provide a semiconductor package. In some embodiments, the semiconductor package may include: a first package including at least one first semiconductor chip; a second package including an external connection terminal and at least one second semiconductor chip, the second package being stacked on the first package; and an interposer disposed between the first and second packages to electrically connect the first and second packages to each other, wherein the interposer comprises an intermediate connector having an exposed end portion to which the second package is electrically connected via the external connection terminal and a protruding end portion lower than the exposed end portion to which the first package is electrically connected.

In one embodiment, the interposer comprises: a mediation connection pad exposed through a top surface of the interposer which constitutes the exposed end portion of the intermediate connector; and a mediation connection lead protruding through a side surface of the interposer which constitutes the protruding end portion of the intermediate connector.

In one embodiment, the semiconductor package further comprises a bonding layer disposed between the interposer and the first semiconductor chip to bond the interposer onto the first semiconductor chip.

In one embodiment, the mediation connection lead is attached to a bonding wire for electrically connecting the interposer to the first package.

In one embodiment, the first package further comprises a redistributed pad which is disposed on an edge of the first semiconductor chip to be connected to the mediation connection lead.

In one embodiment, the first package further comprises a molding layer to mold the at least one first semiconductor chip and the interposer while exposing the top surface of the interposer.

In one embodiment, the interposer has a stepped structure.

In one embodiment, the interposer comprises a through-hole formed through central portion thereof through which a center of the first semiconductor chip is exposed.

In one embodiment, the interposer comprises an exposed lead exposed through a top surface of the interposer which constitutes the exposed end portion of the intermediate connector; and a protruding lead protruding through the through-hole which constitutes the protruding end portion of the intermediate connector.

In one embodiment, the first package comprises: a first redistributed pad disposed on the center of the first semiconductor chip to be connected to the protruding lead; and a second redistributed pad disposed on an edge of the first semiconductor chip to be electrically connected to the first redistributed pad.

In another aspect, exemplary embodiments of the present invention provide a semiconductor package. In some embodiments, the semiconductor package may include: a first package including at least one first semiconductor chip on which a redistributed pad is disposed; a second package including an external connection terminal and at least one second semiconductor chip, the second package being stacked on the first package; and an interposer between the first and second packages to electrically connect the first and second packages to each other, the interposer having a slit formed through central portion thereof to expose a center of the first semiconductor chip, wherein the interposer comprises a first lead having a first exposed portion to which the second package is electrically connected and a first protruding end portion to which the first package is electrically connected via the slit.

In another embodiment, the first exposed portion is exposed through a top surface of the interposer to be electrically connected to the external connection terminal and the first protruding end portion protrudes downwardly through the slit to be electrically connected to the redistributed pad.

In another embodiment, the interposer further comprises a second lead having a second exposed portion which is exposed through the top surface of the interposer to be electrically connected to the external connection terminal and a second protruding end portion which protrudes laterally through the slit not to be electrically connected to the redistributed pad.

In another embodiment, the interposer has an opening exposing at least one of the first and second exposed portions and providing a space into which the external connection terminal is inserted such that the external connection terminal is connected to the at least one of the first and second exposed portions.

In another embodiment, the redistributed pad comprises: a first redistributed pad disposed on the center of the first semiconductor chip to be connected to the first protruding end portion of the first lead; and a second redistributed pad disposed on an edge of the first semiconductor chip to be electrically to the first redistributed pad.

In another embodiment, the second redistributed pad is attached to a bonding wire for electrically connecting the interposer to the first package.

In another embodiment, the semiconductor package further comprises a bonding layer to bond the interposer onto the first semiconductor chip.

In another embodiment, the first package further comprises a molding layer to mold the at least one first semiconductor chip and the interposer while exposing one surface of the interposer.

In another embodiment, the molding layer further molds the slit.

According to another aspect, exemplary embodiments of the present invention provide a method for manufacturing a semiconductor package. In some embodiments, the method may include: providing a first package in which a plurality of first semiconductor chips are mounted on a first printed circuit board; providing a second package in which a plurality of second semiconductor chips are mounted on a second printed circuit board to which an external connection terminal is attached, wherein the interposer comprises an intermediate connector having a first portion which is exposed through one surface of the interposer and a second portion which protrudes through another surface of the interposer; providing an interposer between the first and second packages to be electrically connected to the first and second packages; and electrically connecting the first and second packages to each other by mediation of the interposer.

In one embodiment, electrically connecting the first and second packages to each other comprises: stacking the interposer on an uppermost first semiconductor chip among the plurality of first semiconductor chips; electrically connecting the second portion of the intermediate connector to the first printed circuit board to electrically connect the interposer to the first package; and stacking the second package on the interposer to connect the external connection terminal to the first portion of the intermediate connector to electrically interposer to the second package.

In one embodiment, providing the first package further comprises forming a redistributed pad on the uppermost first semiconductor chip to be connected to the second portion of the intermediate connector of the interposer.

In one embodiment, the method further comprises molding the first package and the interposer. The top surface of the interposer is not molded to expose the first portion of the intermediate connector.

In one embodiment, the interposer comprises: a substrate having a bottom surface facing the uppermost first semiconductor chip, a top surface opposite to the bottom surface, and a side surface connecting the top and bottom surfaces to each other; a mediation connection pad exposed through the top surface of the substrate to be connected to the external connection terminal, the mediation connection pad constituting the first portion of the intermediate connector; and a mediation connection lead electrically connected to the mediation connection pad and protruding through the side surface of the substrate to be connected to the redistributed pad, the mediation connection lead constituting the second portion of the intermediate connector.

In one embodiment, the interposer comprises: a substrate including a first lead connected to the external connection terminal and the redistributed pad, a second lead connected to the external connection terminal but not connected to redistributed pad, and an opening exposing the first and second leads, wherein the external connection terminal is inserted into the opening.

In one embodiment, the interposer comprises: a substrate having a bottom surface facing the uppermost first semiconductor chip, a top surface opposite to the bottom surface, and a side surface connecting the top and bottom surfaces to each other; a mediation connection pad exposed through the top surface of the substrate to be connected to the external connection terminal, the mediation connection pad constituting the first portion of the intermediate connector; and a mediation connection lead electrically connected to the mediation connection pad and protruding through the side surface of the substrate to be connected to the first printed circuit board, the mediation connection lead constituting the second portion of the intermediate connector.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1A:
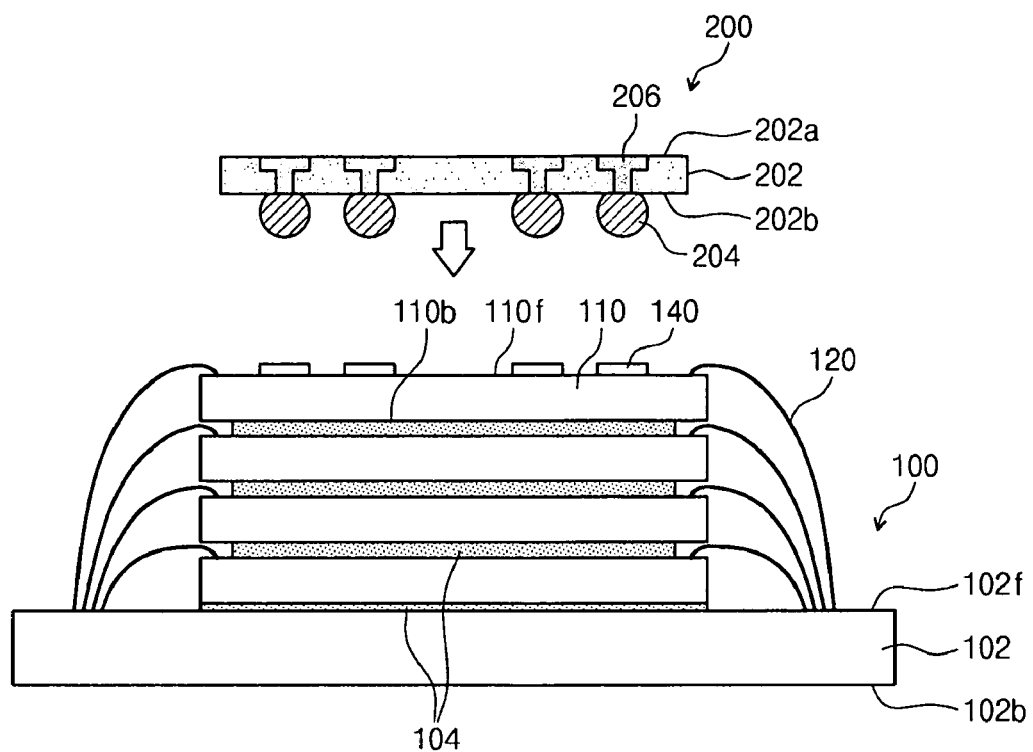
FIGS. 1A to 1D are cross-sectional views illustrating a method for manufacturing a semiconductor package according to a first embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this description will be thorough and complete, and will fully convey the invention to those skilled in the art. In the drawings, the thicknesses of layers and regions are exaggerated for clarity. Like numbers refer to like elements throughout.

Embodiment 1

FIGS. 1A to 1D are cross-sectional views illustrating a method for manufacturing a semiconductor package according to a first embodiment of the present invention.

Referring to FIG. 1A, a first semiconductor package 100 and an interposer 200 are provided. In an example of providing the first semiconductor package 100, a first printed circuit board (PCB) 102 having a front side 102f and a back side 102b may be provided and one or more first semiconductor chips 110 may be mounted on the front side 102f of the first PCB 102. The first semiconductor chip 110 may be a memory chip or a logic chip or combination thereof. In the case where a plurality of first semiconductor chips 110 are stacked, some chips may be memory chips and the remaining chips may be logic chips. In this embodiment, an example of stacking a plurality of first semiconductor chips 110 on the front side 102f of the first PCB 102 will be described in detail. The description set forth below may be applied to the case of mounting one first semiconductor chip 110 on the first PCB 102.

The first semiconductor chips 110 may be stacked such that their inactive surfaces 110b face the front side 102f of the first PCB 102 and their active surfaces 110f face up. A bonding layer 104 may be interposed between the first PCB 102 and the first semiconductor chip 110. Similarly, a plurality of bonding layers 104 may be interposed between the first semiconductor chips 110. The first semiconductor chips 110 and the first PCB 102 may be electrically connected to each other through electrical connection members such as, for example, a plurality of first bonding wires 120. Both ends of the first boding wire 120 may be in contact with pads (not shown) which are disposed on the active surface 110f and the front side 102f, respectively.

In some embodiments, a redistributed pad 140 may be formed on the active surface 110f of an uppermost first semiconductor chip 110. Alternatively, a first semiconductor chip 110 with a pre-formed redistributed pad 140 may be stacked on an uppermost layer of the first semiconductor package 100.

Figure 5:
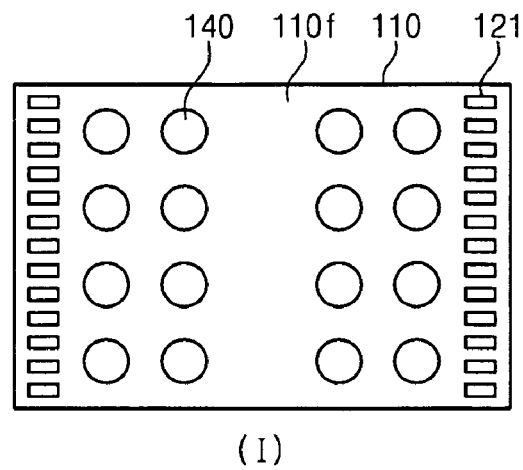
FIG. 5 is a top plan view illustrating arrangement examples of redistributed pads.
Figure 5:
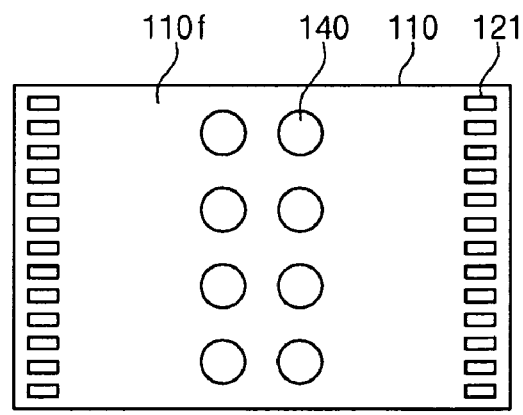
Figure 5:
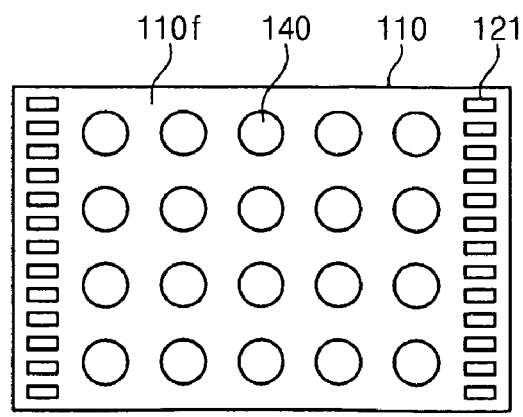

FIG. 5 is a top plan view illustrating an exemplary arrangement of redistributed pads 140 according to the invention. Referring to FIGS. 1A and 5, the arrangement of the redistributed pads 140 may be variously altered. For example, the redistributed pads 140 may be arranged concentrically on edges of the active surface 110f of the uppermost semiconductor chip 110 (see "I" in FIG. 5). Alternatively, the redistributed pads 140 may be arranged concentrically on a center of the active surface 110f (see "II" in FIG. 5). Alternatively, the redistributed pads 140 may be arranged uniformly over an entire area of the active surface 110f (see "III" in FIG. 5). A plurality of bonding pads 121 may be disposed on the edges of the active surface 110f to be connected to the bonding wire 120.

Returning to FIG. 1A, an interposer 200 may include a substrate 202 having a first surface 202a and a second surface 202b which face each other. An electrical connection structure may be formed on both the first and second surfaces 202a and 202b of the interposer 200. That is, the interposer 200 may be a "dual-face" interposer. For example, connection pads 206 such as ball lands may be formed on the first surface 202a, and connection terminals 204 such as solder balls or bumps may be formed on the second surface 202b to be electrically connected to the connection pads 206. In this case, connection terminals 204 such as solder balls or bumps may be in contact with the connection pads 206. Since the arrangement of the connection terminals 204 may match that of the redistributed pads 140, the connection terminals 204 may be vertically aligned with the redistributed pads 140.

Figure 1B:
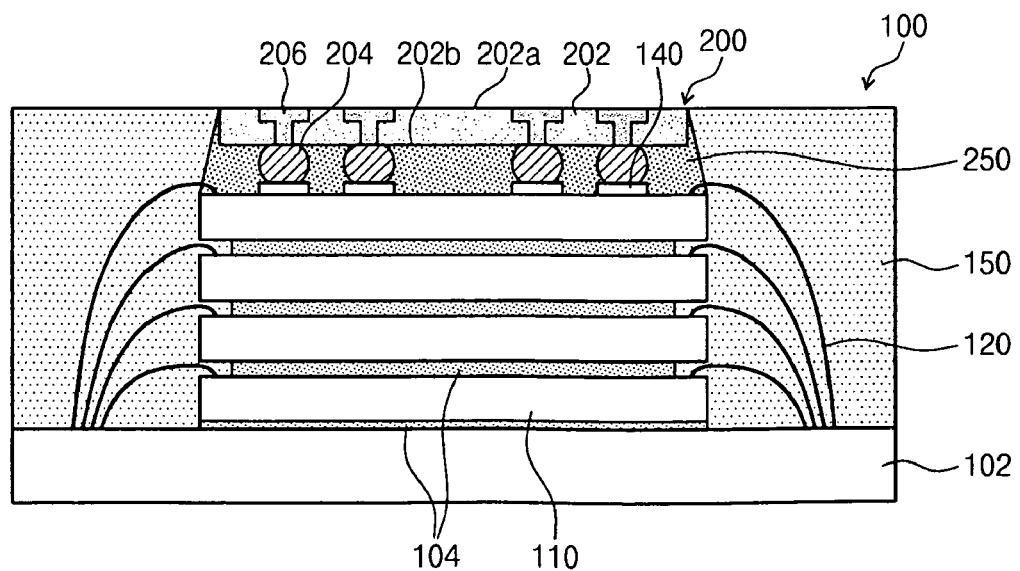

Referring to FIG. 1B, the interposer 200 may be stacked on the first semiconductor package 100 to contact the connection terminal 204 with the redistributed pad 140. Thus, the first semiconductor package 100 and the interposer 200 may be electrically connected to each other. Heat may be applied to obtain tight bonding between the connection terminal 204 and the redistributed pad 140.

A space between the first semiconductor chip 110 and the interposer 200 is filled with an insulating material to form an under-filling layer 250. Thus, the under-filling layer 250 may enable the connection terminal 204 and the redistributed pad 140 to more tightly bond to each other. Subsequently, a first molding layer 150 may be formed. The first molding layer 150 may be formed to be of a type of exposed mold. In an exemplary embodiment, the first molding layer 150 may be formed to mold the plurality of first semiconductor chips 110 and the interposer 200 while exposing the first surface 202a of the substrate 202. The connection pads 206 may be exposed to prevent the first molding layer 150 from covering the first surface 202a. Therefore, it is possible to readily establish an electrical connection between a second semiconductor chip (300 in FIG. 1C) and the interposer 200, as set forth below.

Figure 1C:
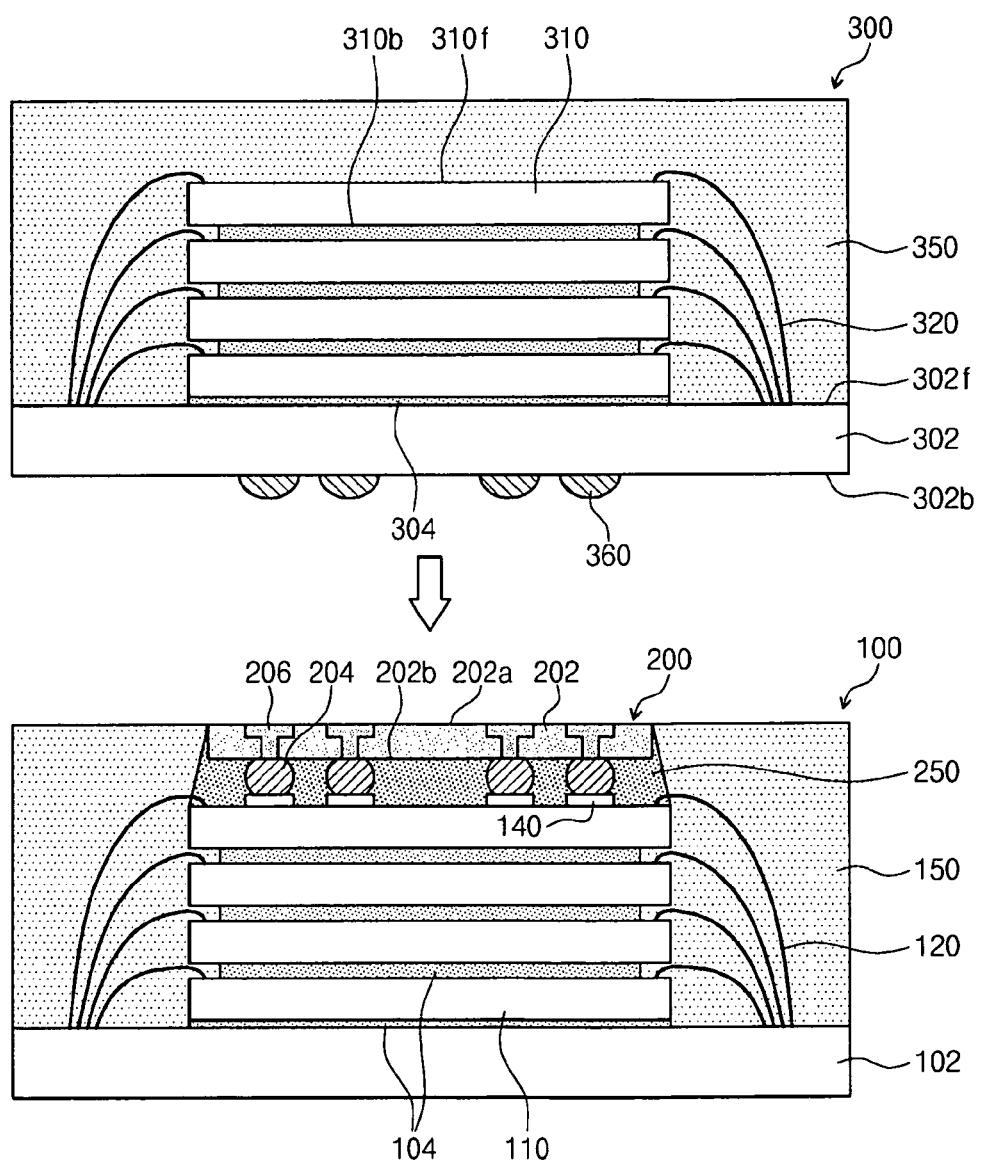

Referring to FIG. 1C, a second semiconductor package 300 is provided on the first semiconductor package 100 with the interposer 200 interposed therebetween. The first and second semiconductor packages 100 and 300 are to be electrically connected to each other. The second semiconductor package 300 may be formed to have the same/similar structure as/to the first semiconductor package 100. For example, the second semiconductor package 300 may include a plurality of second semiconductor chips 310 which are stacked on a front side 302f of a second printed circuit board (PCB) 302 and encapsulated by a second molding layer 350. A plurality of bonding layers 304 may be inserted between the second PCB 302 and the second semiconductor chip 310 and between the second semiconductor chips 310.

The plurality of semiconductor chips 310 may be electrically connected to the second PCB 302 by a plurality of second bonding wires 320.

The second semiconductor package 300 is, for example, a ball grid array (BGA) type package and may include a plurality of solder balls 360 on a back side 302b of the second PCB 302. Since the number and arrangement of the solder balls 360 may be equivalent to those of the connection pads 206, the solder balls 360 and the connection pads 206 may be vertically aligned.

In this embodiment, the second semiconductor package 300 is not provided with a redistributed pad. However, in the case where a third semiconductor package is further stacked on the second semiconductor package 300 by mediation of another interposer, a redistributed pad 140 such as that shown in FIG. 1A may be further formed on an active surface 310f of the second semiconductor chip 310 of an uppermost layer of the second semiconductor package 300.

Figure 1D:
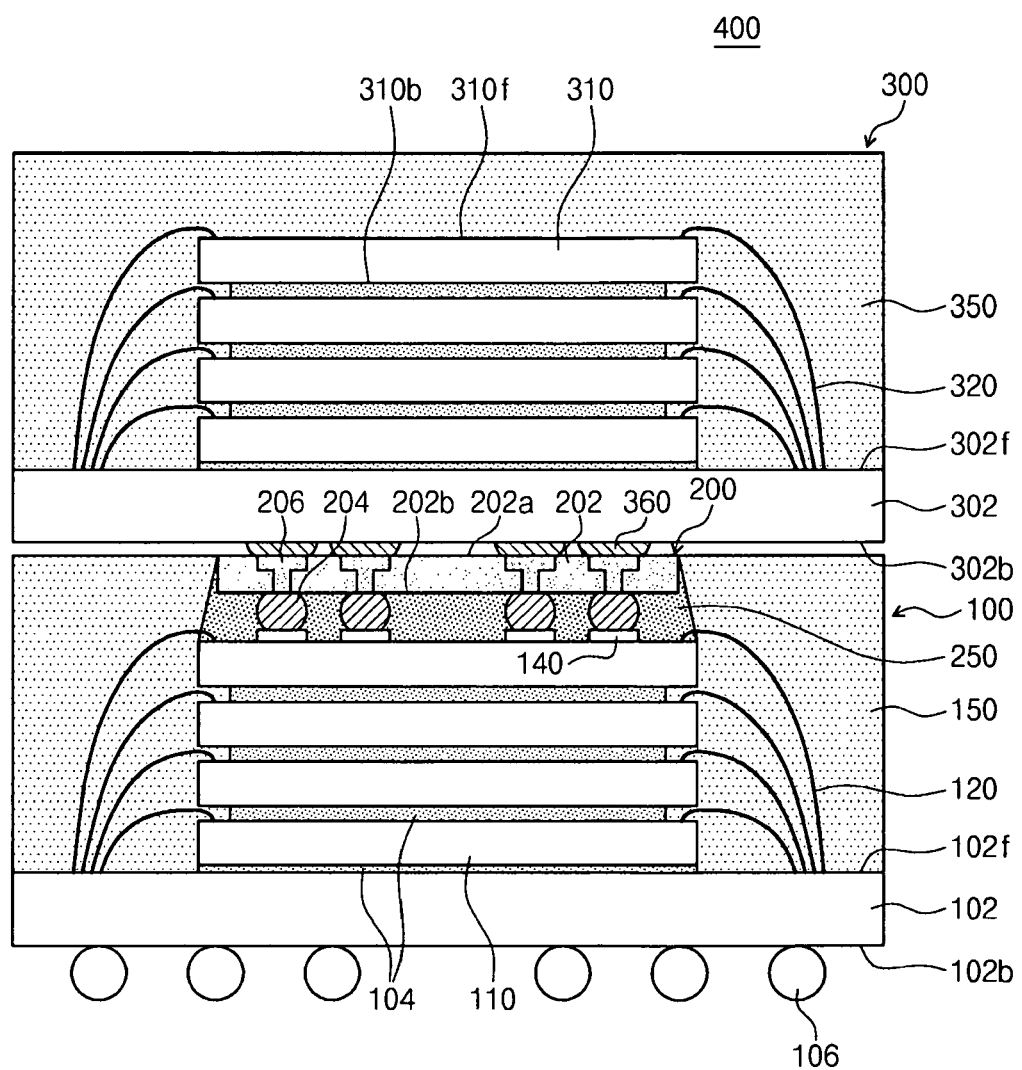

Referring to FIG. 1D, the second semiconductor chip 300 is stacked on the interposer 200 to contact the solder balls 360 with the connection pads 206. Heat may be applied to achieve tight contact between the solder ball 360 and the connection pads 206.

Through the foregoing series of procedures, a Fan-in PoP type package 400 may be achieved in which the second semiconductor package 300 is stacked on the first semiconductor package 100 by mediation of the interposer 200. A plurality of solder balls 106 may be attached to the back side 102b of the first PCB 102 as external connection terminals.

Embodiment 2

Figure 2:
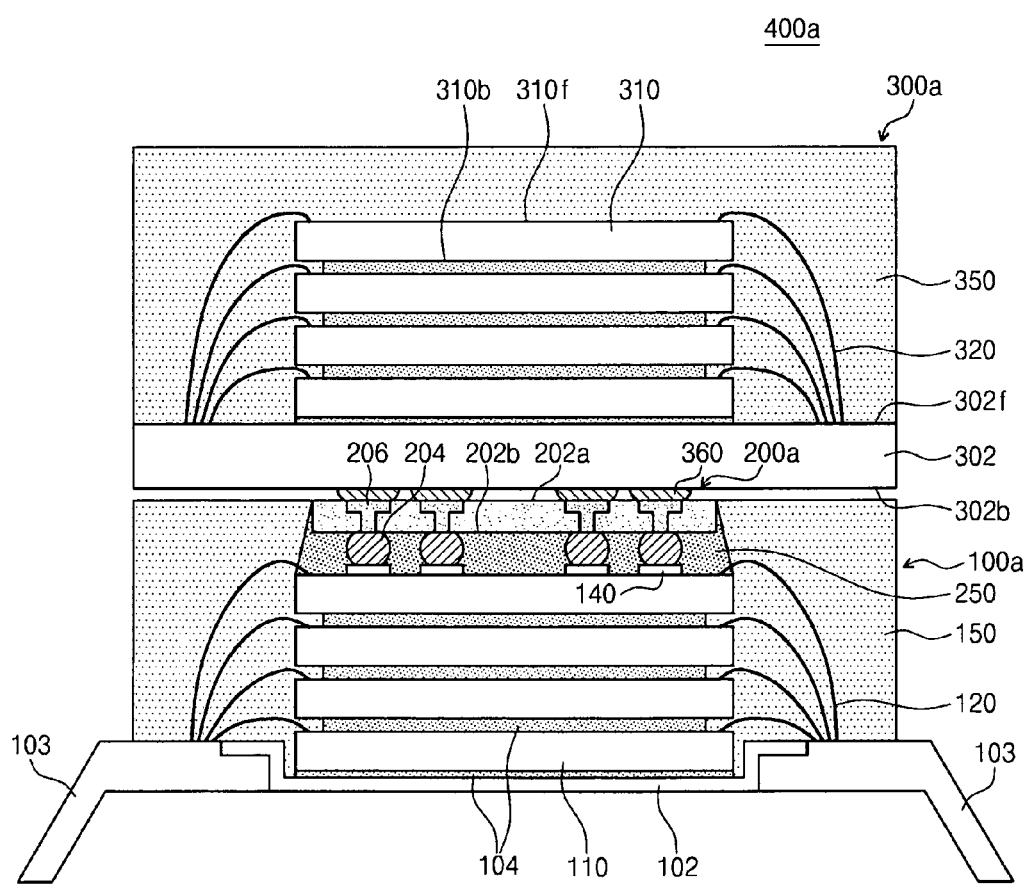
FIG. 2 is a cross-sectional view illustrating a method for manufacturing a semiconductor package according to a second embodiment of the present invention.

FIG. 2 is a cross-sectional view illustrating a method for manufacturing a semiconductor package according to a second embodiment of the present invention. Because the second embodiment is similar to the first embodiment, differences will be described in detail while similarities will be described in brief or not be described in order to avoid repetitive description.

Referring to FIG. 2, through the series of procedures described with reference to FIGS. 1A to 1D, a second semiconductor package 300a may be stacked on a first semiconductor package 100a with an interposer 200a interposed therebetween. The second semiconductor package 300a of the second embodiment may have a same or similar structure (e.g., ball grid array (BGA) type semiconductor package) as the second semiconductor package 300 of the first embodiment. The first semiconductor package 100a of the second embodiment may be a same or similar structure to the first semiconductor package 100 of the first embodiment. The interposer 200a may have a same or similar structure to the interposer 200 of the first embodiment.

Unlike the first embodiment, the first semiconductor package 100a of the second embodiment may be a lead frame type package. The first semiconductor package 100a may include, for example, a lead frame 103 functioning as an external connection terminal. The lead frame 103 may be electrically connected to a first semiconductor chip 110 via a first bonding wire 120.

Using the interposer 200a as connection mediation, the BGA type second semiconductor package 300a may be stacked on the lead frame type first semiconductor package 100a. A solder ball 360 of the second semiconductor package 300a is connected to a connection pad 206 of the interposer 200a and a connection terminal 204 in contact with the connection pad 206 is connected to a redistributed pad 140 of the first semiconductor package 100a, electrically connecting the first and second semiconductor packages 100a and 300a to each other. That is, the BGA type second semiconductor package 300a is stacked on the lead frame type first semiconductor package 100a to achieve a package on package (PoP) type semiconductor package 400a.

Embodiment 3

Figure 3:
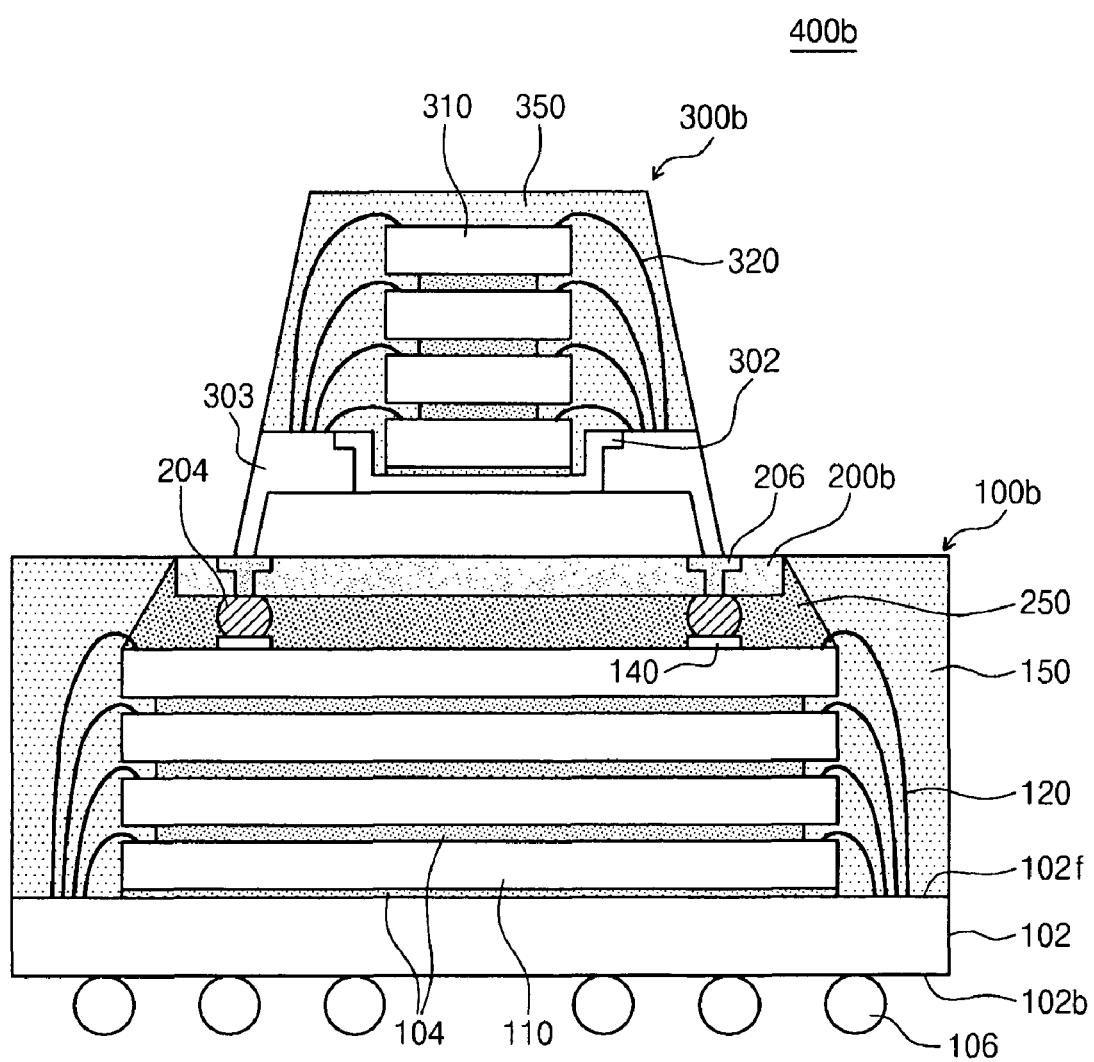
FIG. 3 is a cross-sectional view illustrating a method for manufacturing a semiconductor package according to a third embodiment of the present invention.

FIG. 3 is a cross-sectional view illustrating a method for manufacturing a semiconductor package according to a third embodiment of the present invention. Because the third embodiment is similar to the first embodiment, differences will be described in detail while similarities will be described in brief or will not be described in order to avoid repetitive descriptions.

Referring to FIG. 3, through the series of procedures described with reference to FIGS. 1A to 1D, a second semiconductor package 300b may be stacked on a first semiconductor package 100b with an interposer 200b interposed therebetween. The first semiconductor package 100b of the third embodiment may have a same or similar structure to the first semiconductor package 100 of the first embodiment. The second semiconductor package 300b of the third embodiment may be a lead frame type package, unlike the second semiconductor package 300 of the first embodiment. The second semiconductor package 300b may include, for example, a lead frame 303 functioning as an external connection terminal. The lead frame 303 may be electrically connected to the second semiconductor chip 310 via a second bonding wire 320. The interposer 200b of the third embodiment may be identical or similar to the interposer 200 of the first embodiment.

Using the interposer 200b as a connection mediation, the lead frame type second semiconductor package 300b may be stacked on the BGA type first semiconductor package 100b. The lead frame 303 of the semiconductor package 300b is connected to a connection pad 206 of the interposer 200b and a connection terminal 204 in contact with the connection pad 206 is connected to a redistributed pad 140 of the first semiconductor package 100b, electrically connecting the first and second semiconductor packages 100b and 300b to each other. Thus, the lead frame type second semiconductor package 300b is stacked on the BGA type first semiconductor package to achieve a package on package (PoP) type semiconductor package 400b.

Embodiment 4

Figure 4:
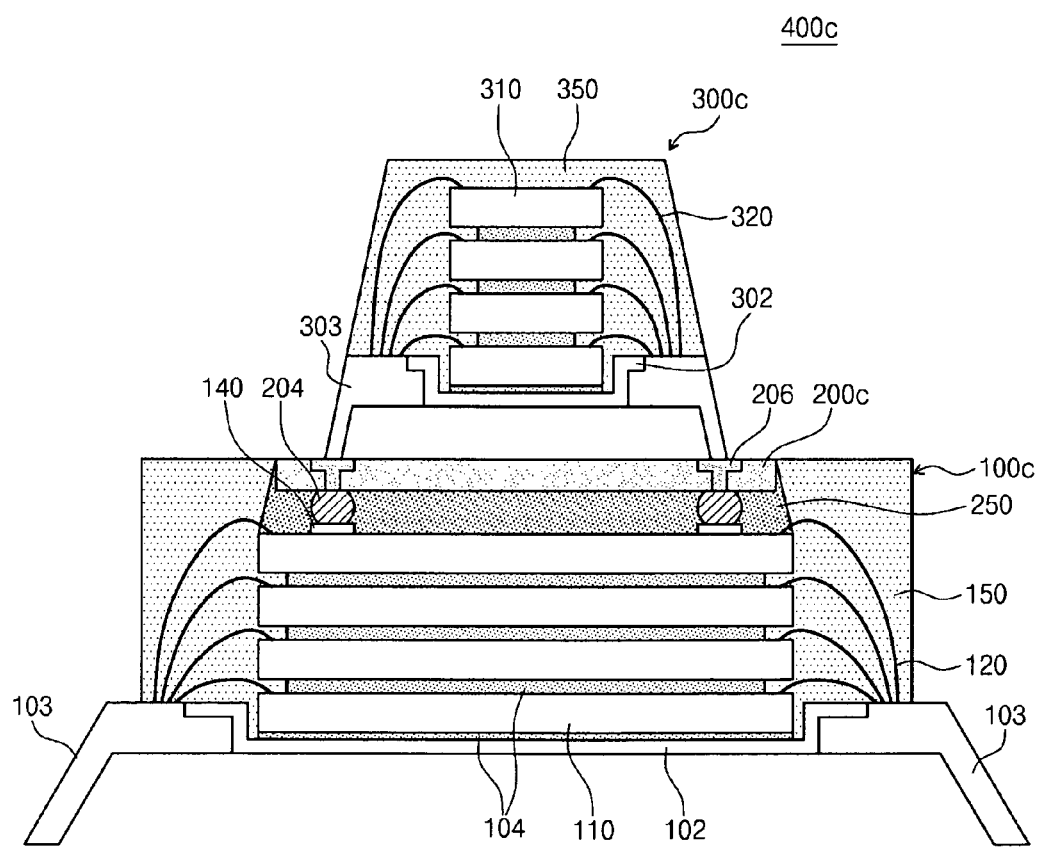
FIG. 4 is a cross-sectional view illustrating a method for manufacturing a semiconductor package according to a fourth embodiment of the present invention.

FIG. 4 is a cross-sectional view illustrating a method for manufacturing a semiconductor package according to a fourth embodiment of the present invention. Because the fourth embodiment is similar to the first embodiment, differences will be described in detail while similarities will be described in brief or will not be described in order to avoid repetitive descriptions.

Referring to FIG. 4, through the series of procedures described with reference to FIGS. 1A to 1D, a second semiconductor package 300c may be stacked on a first semiconductor package 100c with an interposer 200c interposed therebetween. The first semiconductor package 100c of the fourth embodiment may be a lead frame type package including a lead frame 103 functioning as an external connection terminal. Also the second semiconductor package 300c of the fourth embodiment may be a lead frame type package including a lead frame 303. The interposer 200c of the fourth embodiment may be identical or similar to the interposer 200 of the first embodiment.

Using the interposer 200c as a connection mediation, the lead frame type second semiconductor package 300c may be stacked on the lead frame type first semiconductor package 100c. The lead frame 303 of the second semiconductor package 300c is connected to a connection pad 206 of the interposer 200c and a connection terminal 204 in contact with the connection pad 206 is connected to a redistributed pad 140 of the first semiconductor package 100c, electrically connecting the first and second semiconductor packages 100c and 300c to each other. Thus, the lead frame type packages 100c and 300c are stacked to achieve a package on package (PoP) type semiconductor package 400c.

Embodiment 5

FIGS. 6A to 6D are cross-sectional views illustrating a method for manufacturing a semiconductor package according to a fifth embodiment of the present invention. Because the fifth embodiment is similar to the first embodiment, differences will be described in detail while similarities will be described in brief or will not be described in order to avoid repetitive descriptions.

Figure 6A:
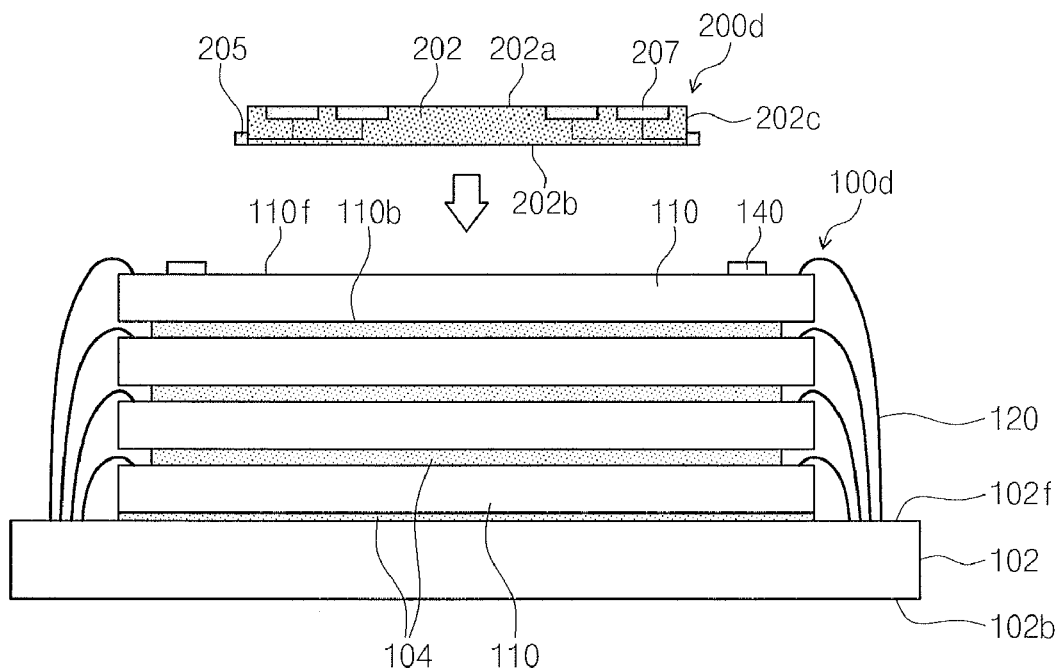
FIGS. 6A to 6D are cross-sectional views illustrating a method for manufacturing a semiconductor package according to a fifth embodiment of the present invention.

Referring to FIG. 6A, a first semiconductor package 100d and an interposer 200d are provided. The first semiconductor package 100d may be, for example, a package where at least one first semiconductor chip 110 is stacked on a front side 202f of a first printed circuit board (PCB) 202 with a bonding layer 104 interposed therebetween. The at least one first semiconductor chip 110 may be electrically connected to the first PCB 202 via at least one first bonding wire 120. An active surface 110f of the first semiconductor chip 110 may be disposed to face up, and an inactive surface 110b thereof may be disposed to face down. At least one redistributed pad 140 may be formed on an active surface 110f of an uppermost first semiconductor chip 110. The redistributed pad 140 may be disposed adjacent to an edge of the active surface 110f.

The interposer 200d may include a substrate 202 having a first surface 202a, a second surface 202b opposite to the first surface 202a, and a side surface 202c. The interposer 200d may have an intermediate connector comprising an exposed end portion 207 and a protruding end portion 205 extended from the exposed end portion 207. The protruding end portion 205 may have a height lower than the exposed end portion 207 and protrude through a lower edge of the side surface 202c. Therefore, the interposer 200d may have a stepped structure. The exposed end portion 207 may be configured to a connection pad 207 and the protruding end portion 205 may be configured to a lead 205. At least one connection pad 207 such as a ball land may be formed on the first surface 202a. A connection terminal such as a solder ball or a bump may be in contact with the ball land. At least one lead 205 electrically connected to at least one connection pad 207 may be formed on the side surface 202c. The at least one lead 205 may protrude from the side surface 202c and be electrically connected to at least one redistributed pad 140.

Figure 8:
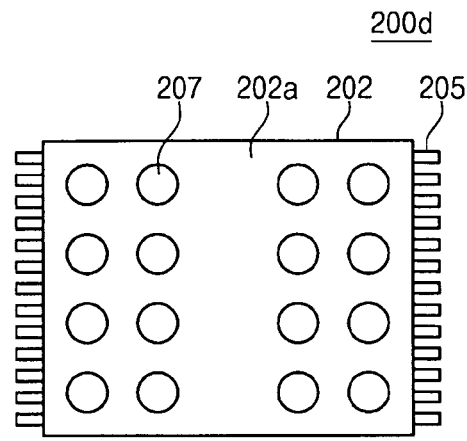
FIG. 8 is a top plan view illustrating various examples of an interposer.
Figure 8:
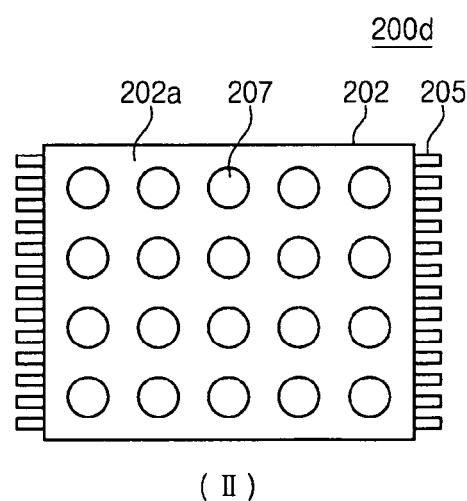
Figure 8:
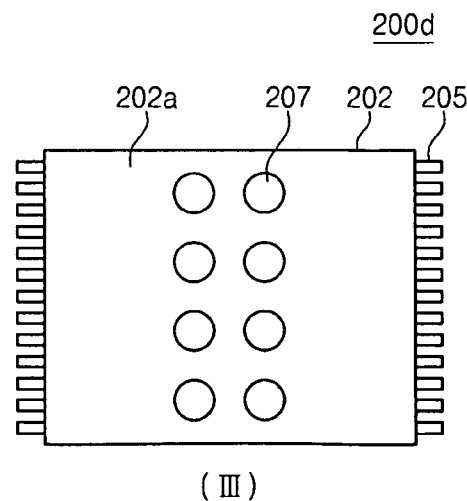

FIG. 8 is a top plan view illustrating various examples of an interposer 202d applicable to the embodiment of FIGS. 6A to 6D. Referring to FIG. 8, an interposer 200d may include connection pads 207 which are concentrically arranged at both edges of the first surface 202a of the substrate 202 (see "I" in FIG. 8). Alternatively, the interposer 200d may include connection pads 207 which are uniformly arranged on the entire area of the first surface 202a (see "II" in FIG. 8). Alternatively, the interposer 200d may include connection pads 207 which are concentrically arranged on a center of the first surface 202a (see "III" in FIG. 8).

Figure 6B:
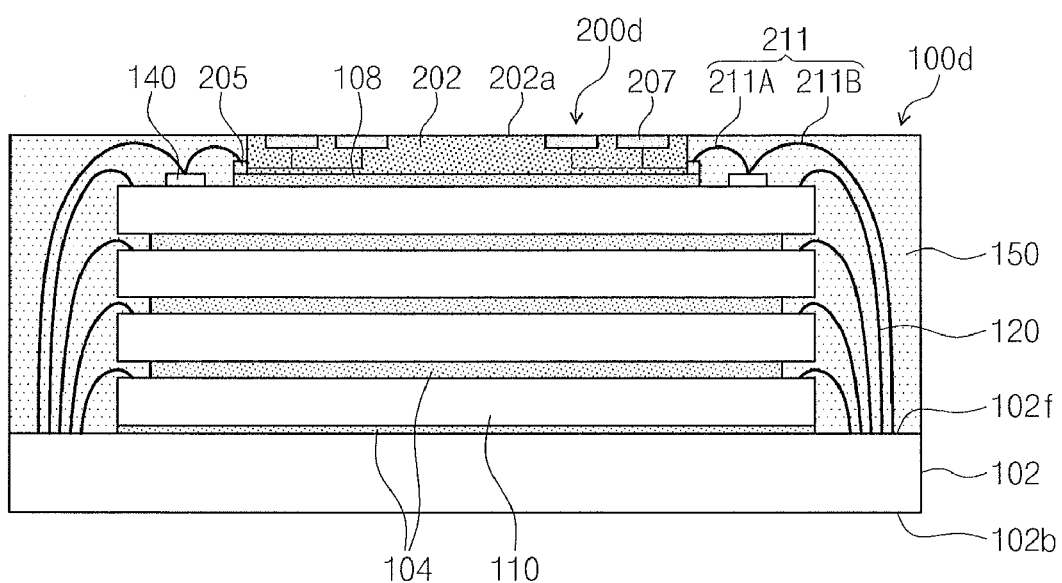

Referring to FIG. 6B, the interposer 200d is stacked on the first semiconductor package 100d. In an exemplary embodiment, a bonding layer 108 is formed between an active surface 110f of an uppermost first semiconductor chip 110 and the interposer 200d to stack the interposer 200d on the uppermost first semiconductor chip 110. A bonding wire 211 is formed to electrically connect the interposer 200d to the first PCB 102. The configuration of the bonding wire 211 will be described below detail.

Figure 9A:
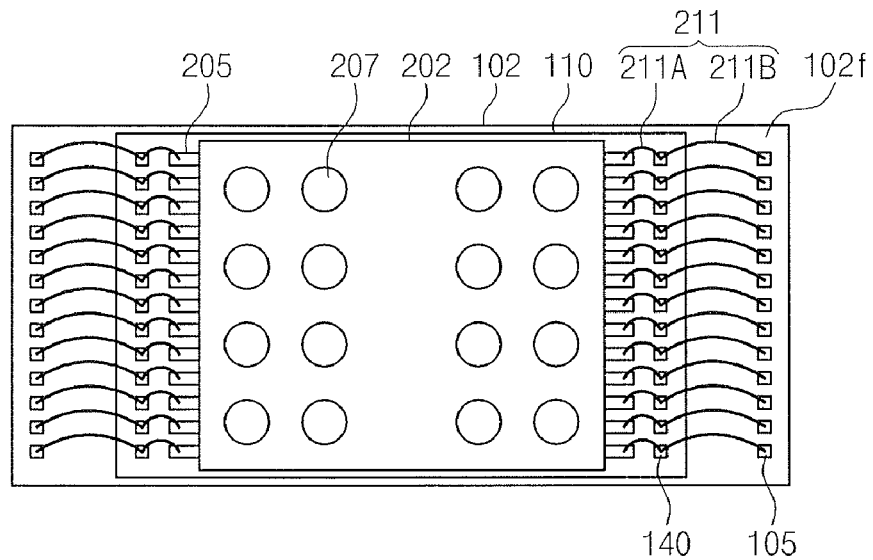
FIG. 9A is a top plan view of a portion in FIG. 6B.

FIG. 9A is a top plan view of a portion in FIG. 6B. Referring to FIG. 9A, a plurality of substrate pads 105 may be formed on the entire surface 102f of the first PCB 102. Thus, the bonding wire 211 may include a first sub-bonding wire 211A electrically connecting the lead 205 to the redistributed pad 140 and a second sub-bonding wire 211B electrically connecting the redistributed pad 140 to the substrate pad 105.

Returning to FIG. 6B, a first molding layer 150 is formed of an insulator including epoxy molding compound (EMC) to mold the first semiconductor package 100d. The first molding layer 150 may be formed in a type of exposed mold. In an exemplary embodiment, the first molding layer 150 may be formed to mold the plurality of first semiconductor chips 110 and the interposer 200d while exposing the first surface 202a of the interposer 200d.

Figure 6C:
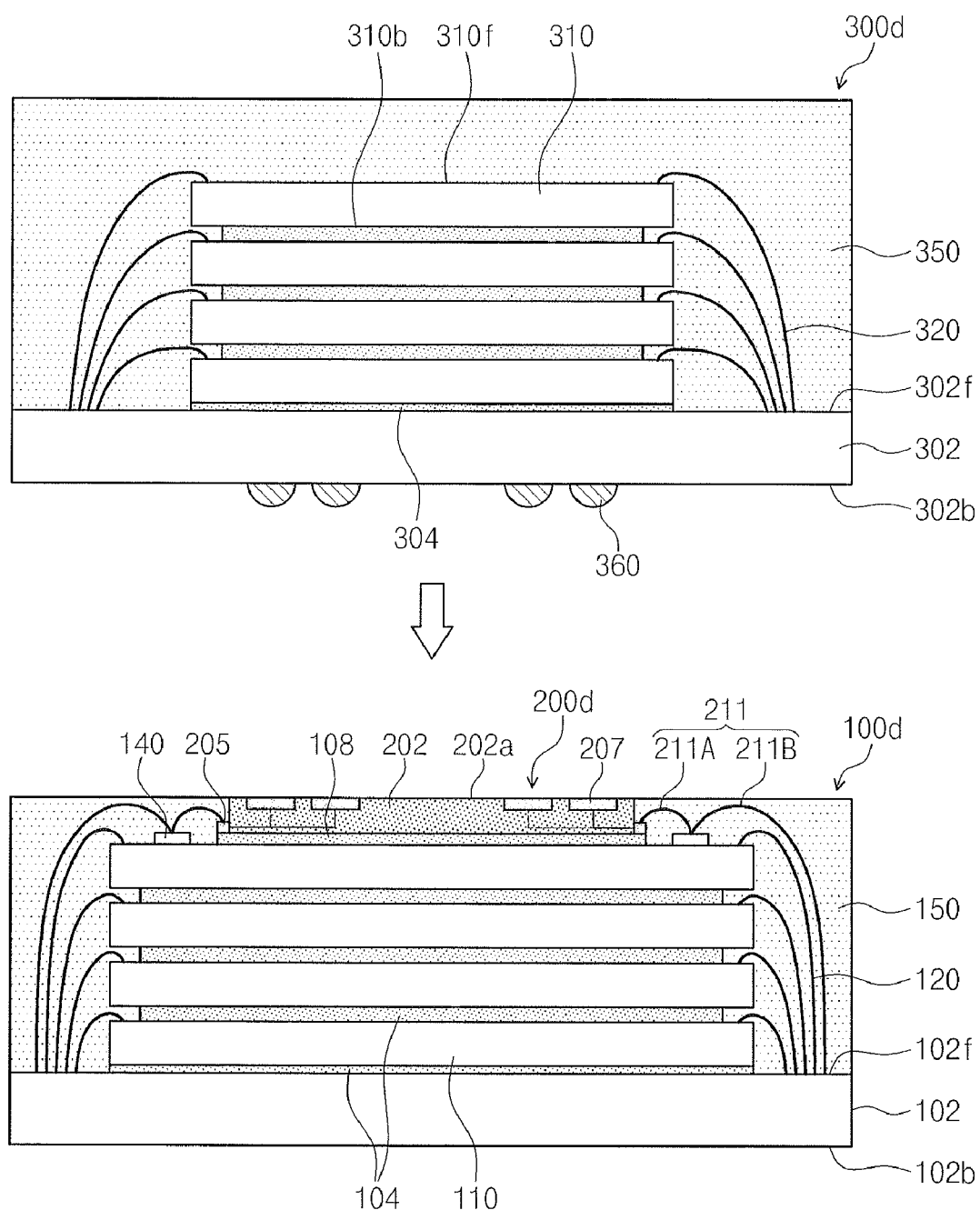

Referring to FIG. 6C, provided is a second semiconductor package 300d to be stacked on the first semiconductor package 100d with the interposer 200d interposed therebetween. The second semiconductor package 300d may be formed to have a same or similar structure to the second semiconductor package 300 described with reference to FIG. 1C.

Figure 6D:
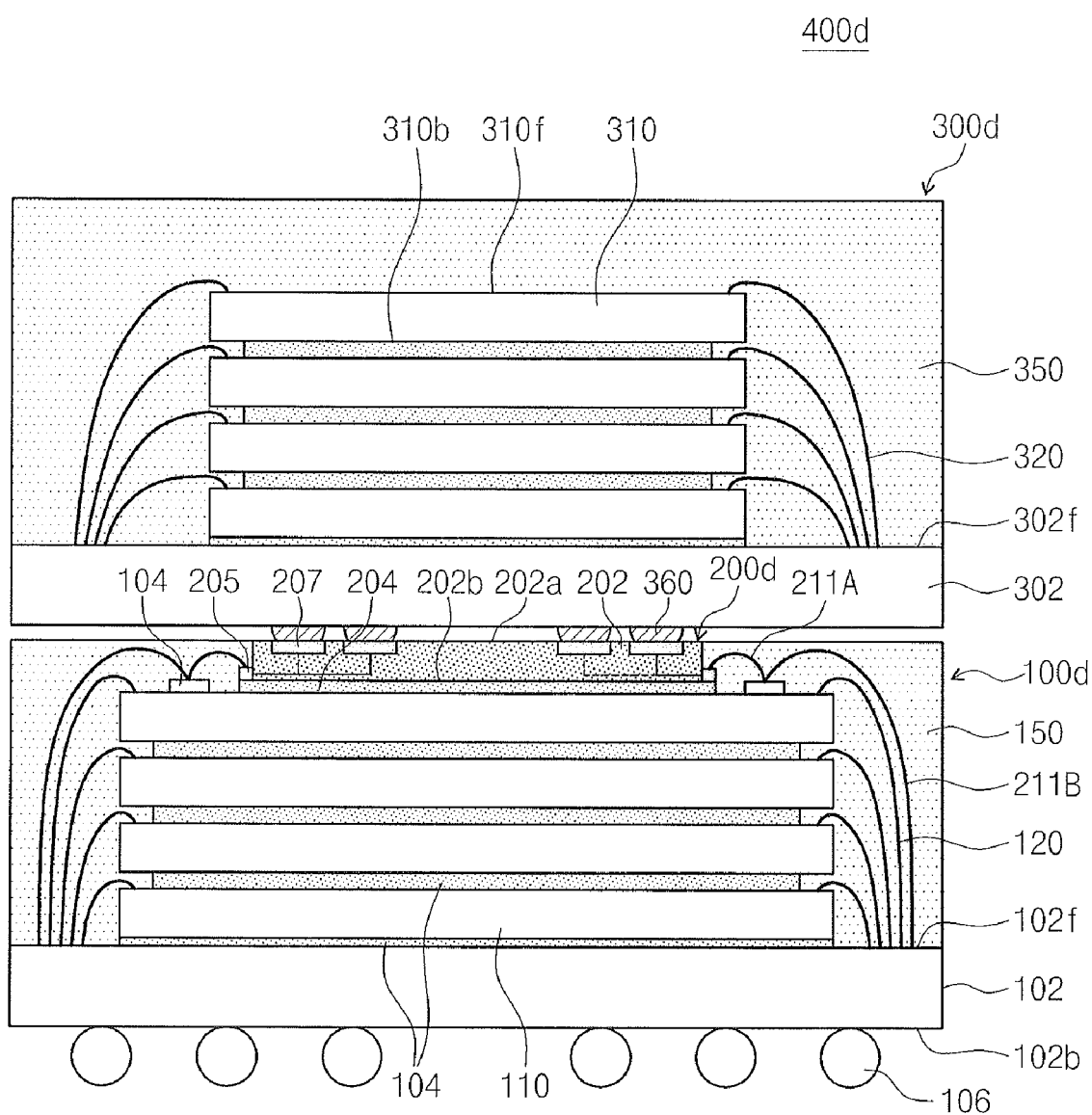

Referring to FIG. 6D, the second semiconductor package 300d is stacked on the interposer 200d to contact a solder ball 360 with a connection terminal 207. Thus, the second semiconductor package 300d may be electrically connected to the interposer 200d.

Through the foregoing series of procedures, a Fan-in PoP type package 400d may be achieved in which the first and second semiconductor packages 100d and 300d are electrically connected to each other by mediation of the interposer 200d. Optionally, for example, a plurality of solder balls 106 may be further attached to a back side 102b of the first PCB 102 as external connection terminals.

In the semiconductor package 400d, at least one of the first and second semiconductor packages 100d and 300d may be formed to have a lead frame structure, as illustrated in FIGS. 2 to 4.

Embodiment 7

Figure 7:
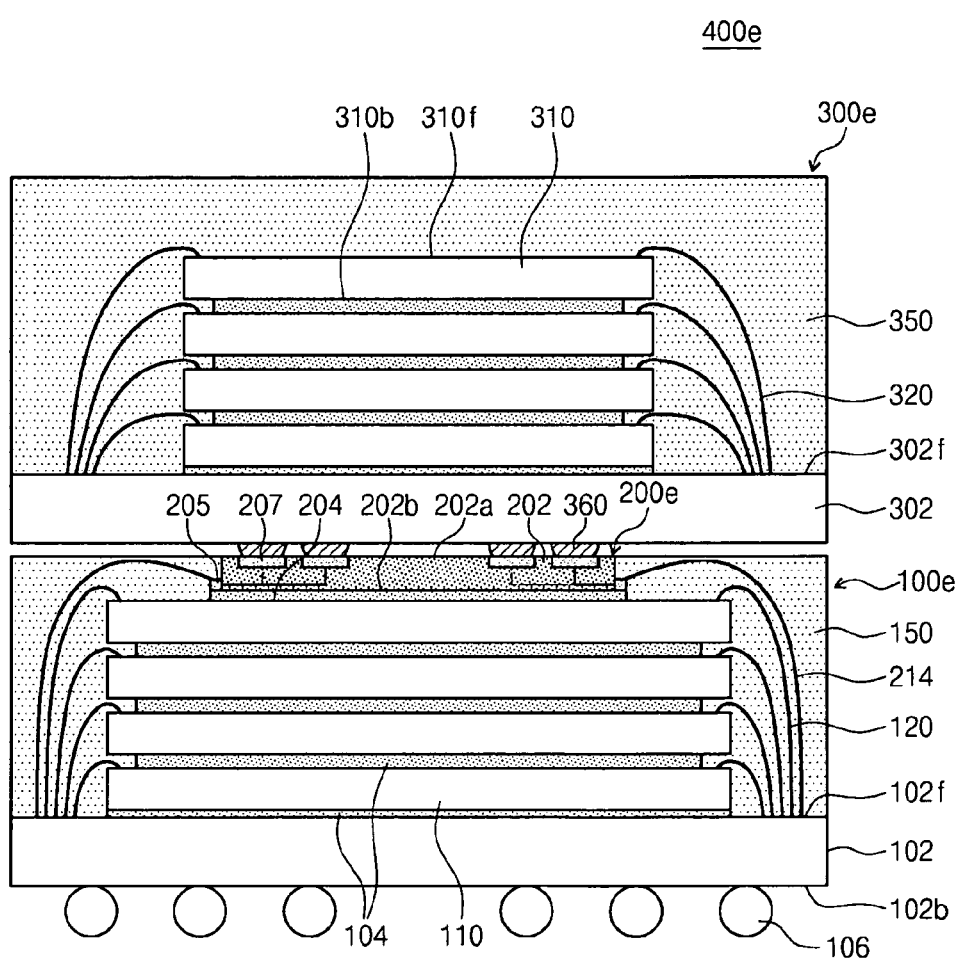
FIG. 7 is a cross-sectional view illustrating a method for manufacturing a semiconductor device according to a sixth embodiment of the present invention.
Figure 9B:
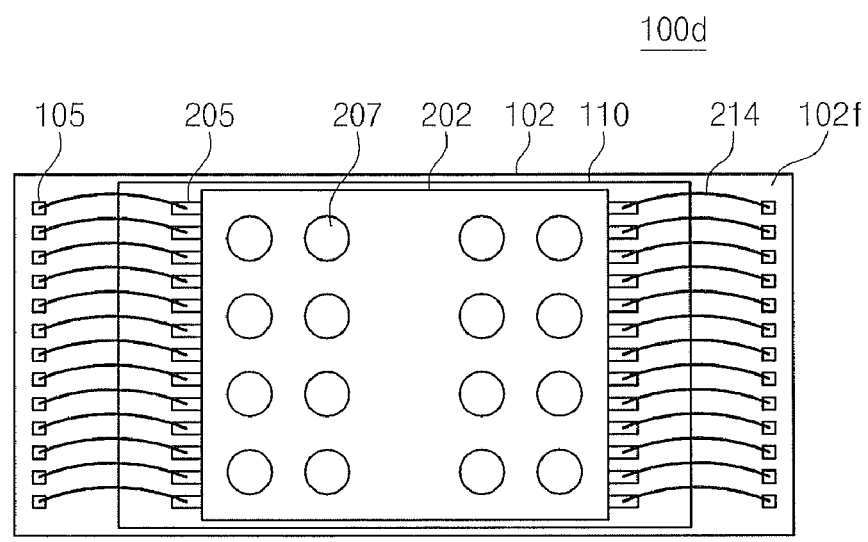
FIG. 9B is a top plan view of a portion in FIG. 7.

FIG. 7 is a cross-sectional view illustrating a method for manufacturing a semiconductor device according to a sixth embodiment of the present invention, and FIG. 9B is a top plan view of a portion in FIG. 7. Because the sixth embodiment is similar to the fifth embodiment, differences will be described in detail while similarities will be described in brief or will not be described in order to avoid repetitive descriptions.

Referring to FIG. 7, similar to the descriptions of FIGS. 6A to 6D, an interposer 200e is stacked on a first semiconductor package 100e and a second semiconductor package 300e is stacked on the first semiconductor package 100e with the interposer 200e interposed therebetween to achieve a package on package (PoP) type semiconductor package 400e. The first semiconductor package 100e of the sixth embodiment may be formed to have a same or similar structure as the first semiconductor package 100d of the fifth embodiment. Similarly, the interposer 200e of the sixth embodiment may be formed to have a same or similar structure as the interposer 200d of the fifth embodiment, and the second semiconductor package 300e of the sixth embodiment may be formed to have a same or similar structure to the second semiconductor package 300d of the fifth embodiment.

Unlike the fifth embodiment, a redistributed pad may not be formed on an uppermost first semiconductor chip 110. Accordingly, the interposer 200e is directly and electrically connected to a first printed circuit board (PCB) 102. For example, as shown in FIG. 9B, the interposer 200e may be directly and electrically connected to the first PCB 102 via a bonding wire 214 having one end connected to a lead 205 of the interposer 200e and the other end connected to a substrate pad 105.

Embodiment 7

FIGS. 10A to 10E are cross-sectional views illustrating a method for manufacturing a semiconductor device according to a seventh embodiment of the present invention. Because the seventh embodiment is similar to the first embodiment, differences will be described in detail while similarities will be described in brief or will not be described in order to avoid repetitive descriptions.

Figure 10A:
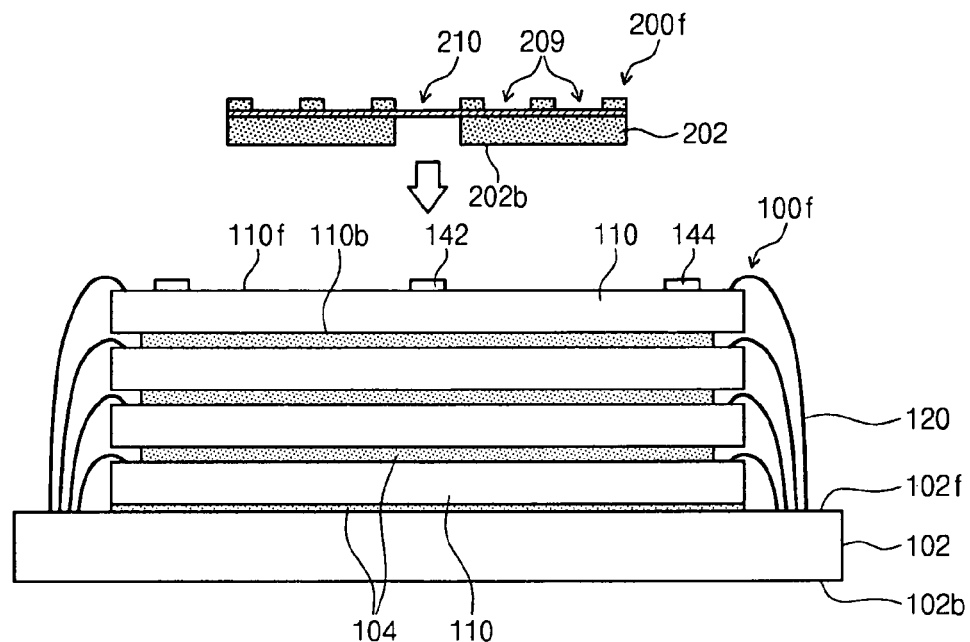
FIGS. 10A to 10E are cross-sectional views illustrating a method for manufacturing a semiconductor device according to a seventh embodiment of the present invention.

Referring to FIG. 10A, a first semiconductor package 100f and an interposer 200f are provided. The first semiconductor package 100f may be formed to have an identical or similar structure to the first semiconductor package 100 of the first embodiment. A first redistributed pad 142 and a second redistributed pad 144 may be formed on an active surface 110f of an uppermost first semiconductor chip 110 to be electrically connected to each other. The first redistributed pad 142 may be formed on a center of the active surface 110f, and the second redistributed pad 144 may be formed on an edge of the active surface 110f.

Figure 10B:
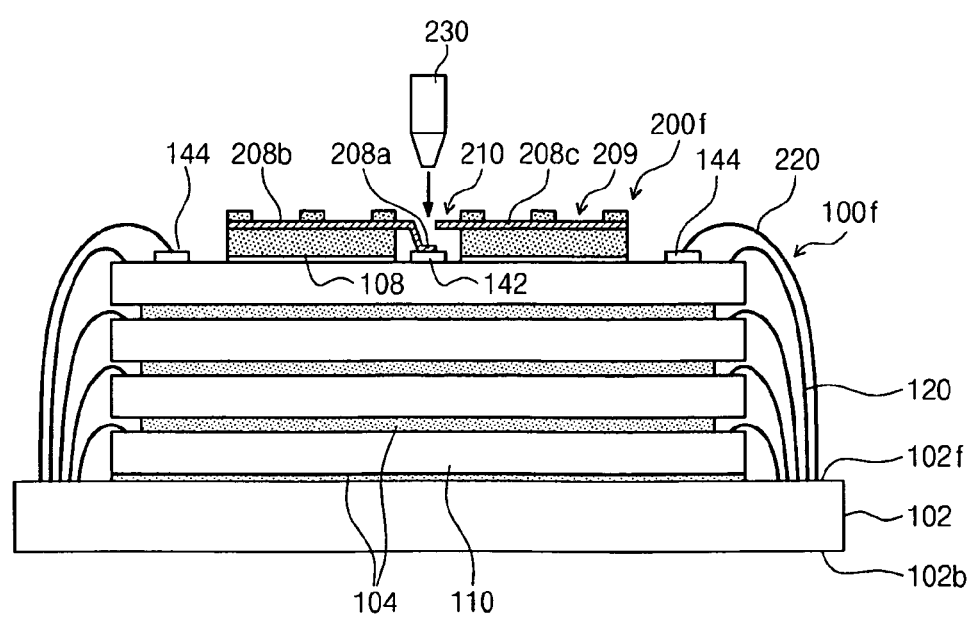
Figure 10C:
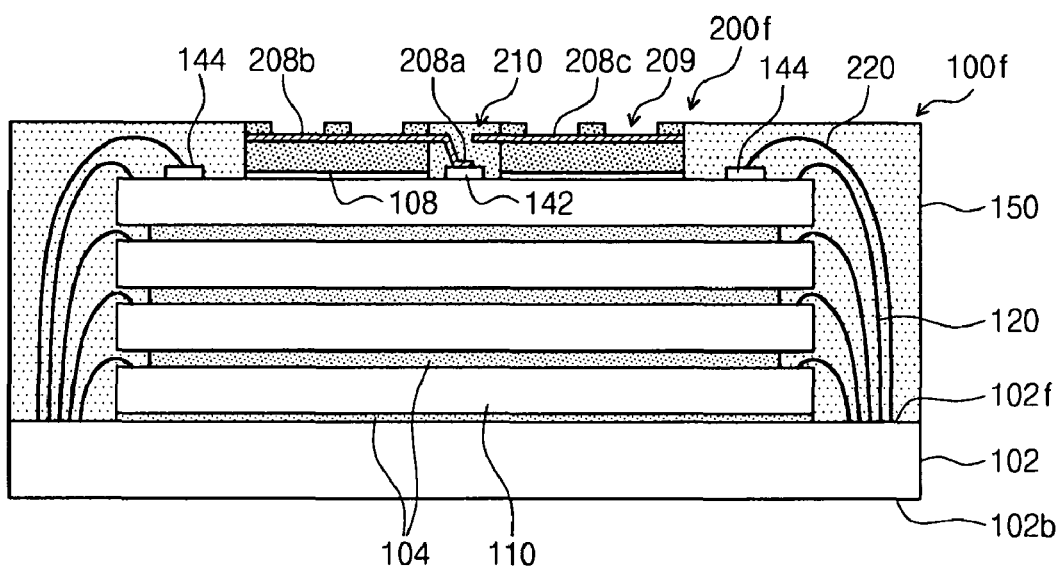
Figure 10D:
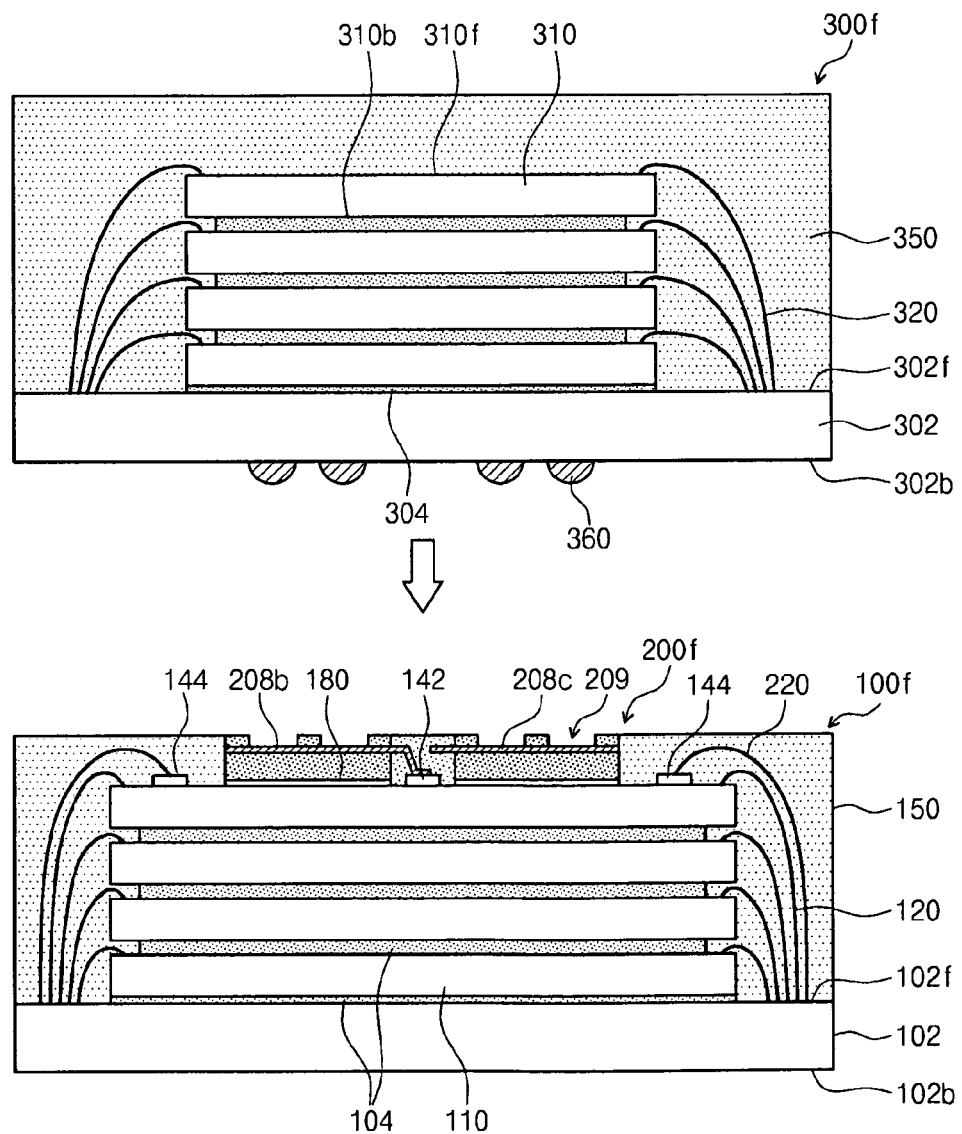
Figure 10E:
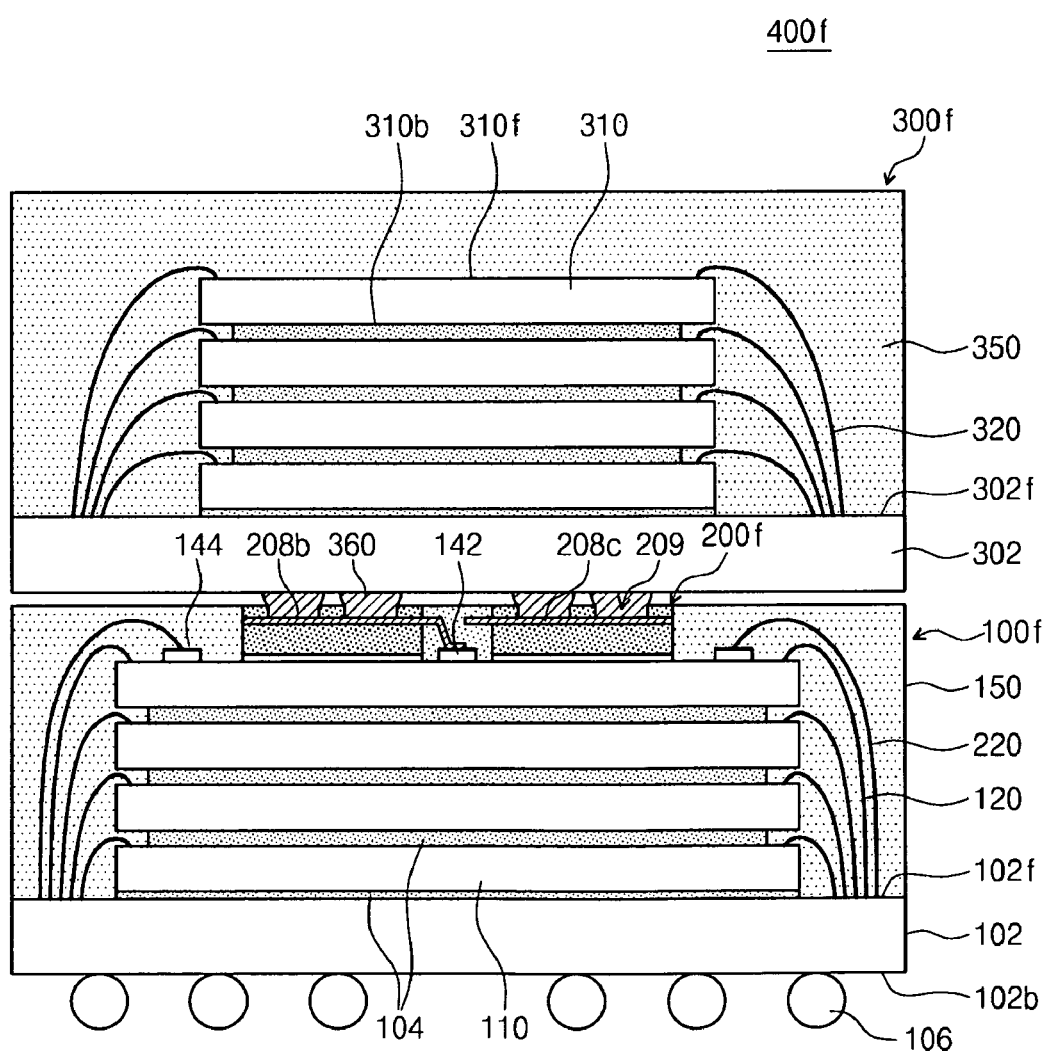
Figure 11A:
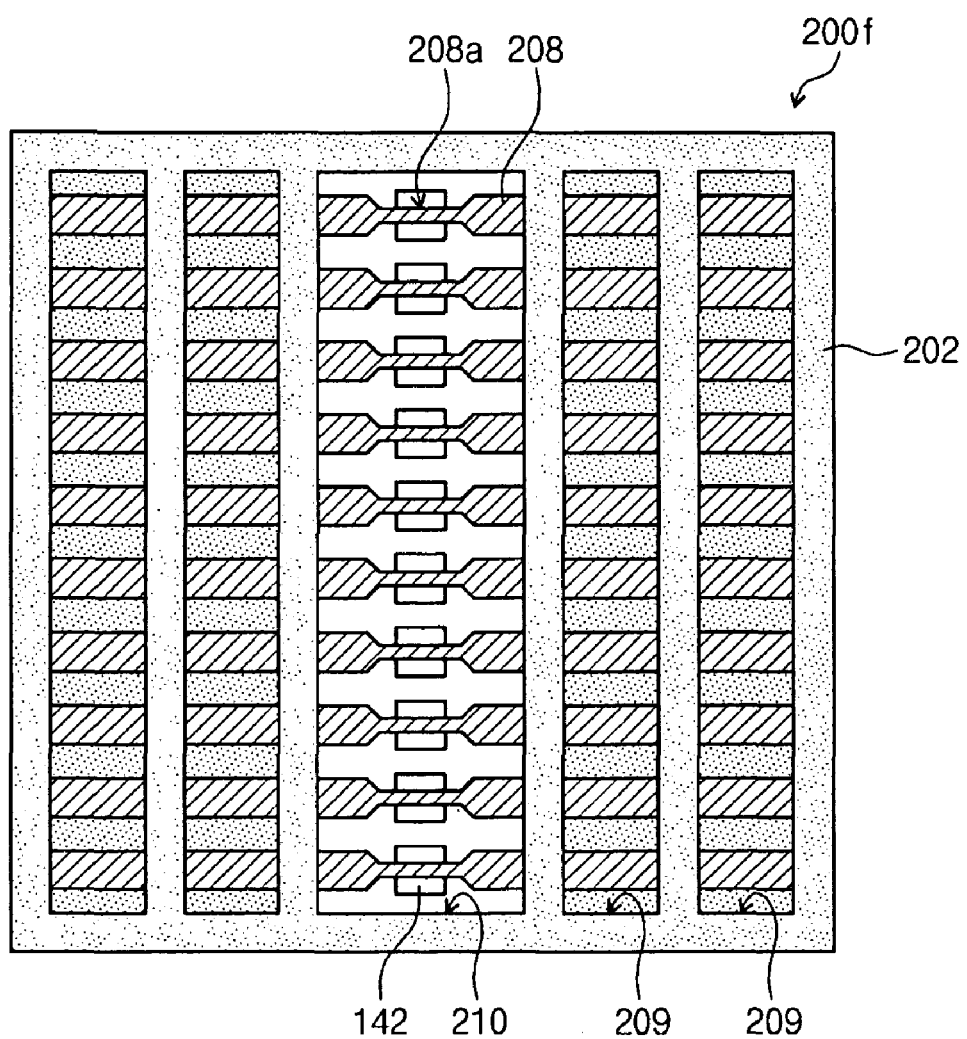
FIG. 11A is a top plan view of an interposer shown in FIG. 10B.

FIG. 11A is a top plan view of an interposer 200f applicable to the embodiment of FIGS. 10A to 10E. Referring to FIGS. 11A and 10A, the interposer 200f may include a plurality of beam leads 208 arranged within a substrate 202 in parallel with one another. The beam lead 208 may be formed of a conductor such as gold, copper, nickel, and combinations thereof. The beam lead 208 may extend from one side (e.g., left side) of the substrate 202 to the other side (e.g., right side) thereof. A central portion of the beam lead 208 may be tapered, i.e., the beam lead 208 has a neck 208a. The substrate 202 may include a through-hole (or slit) 210 formed through the central portion of the substrate 202 to expose the neck 208a of the beam lead 208 and an opening 209 formed to partially expose portions of the beam lead 208. The portions exposed through the openings 209 may be length-directionally extended parts of the beam lead 208. The opening 209 may provide a space into which a solder ball (360 in FIG. 10D) of a second semiconductor package (300f in FIG. 10D) is inserted, as set forth later, to be in contact with the beam lead 208.

Referring to FIG. 10B, the interposer 200f is stacked on the first semiconductor package 100f. In an exemplary embodiment, the interposer 200f may be stacked on an active surface 110f of an uppermost first semiconductor chip 110. In this case, the first redistributed pad 142 may be exposed via the through-hole 210 and the neck 208a of the beam lead 208 is vertically aligned with the first redistributed pad 142. A bonding layer 108 may be inserted between the interposer 200f and the first semiconductor chip 110.

A bonding wire 220 is formed between a first printed circuit board (PCB) 100 and the second redistributed pad 144 (wire bonding) and a portion of the beam lead 208 is connected to the first redistributed pad 142 (beam lead bonding), electrically connecting the interposer 200f to the first PCB 100.

The lead bonding may be performed as follows. In an exemplary embodiment, a bonding tool 230 may vertically move down to transfer mechanical power to a portion of the beam lead 208, for example, the neck 208a. Due to the mechanical power applied to the neck 208a, the beam lead 208 is divided into two parts 208b and 208c. Of the two parts 208b and 208c, one part (208b; hereinafter referred to as a "contact beam lead") may be compressed to the first redistributed pad 142 by the bonding tool 230 and the other part (208c; hereinafter referred to as a "non-contact beam lead") may not be compressed by the first redistributed pad 142. According to one exemplary embodiment, contact beam lead 208b may have a stepped structure that the neck (or end portion) 208a is downwardly protruding through the through-hole 210 and non-contact beam lead 208c may have a linear structure that end portion is laterally protruding through the through-hole 210. In one embodiment, supersonic vibration may be further applied to the contact beam lead 208b, tightly contacting the contact beam lead 208b with the first redistributed pad 142.

Figure 11B:
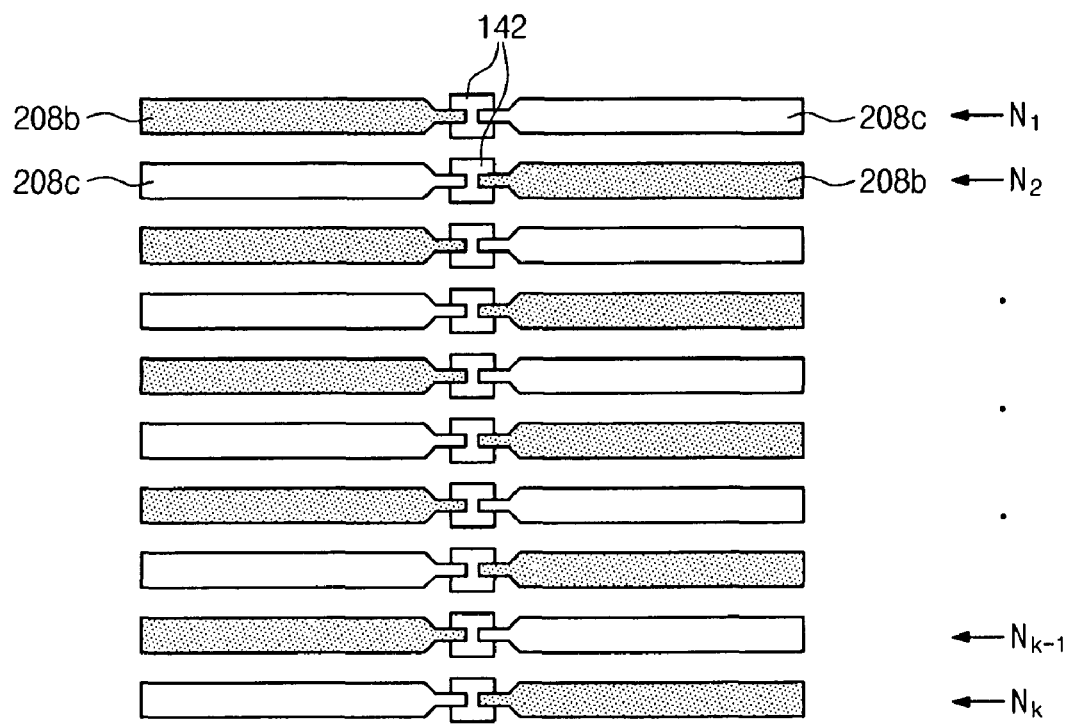
FIG. 11B is a top plan view illustrating connection of a beam lead with a first redistributed pad.

FIG. 11B is a top plan view illustrating a connection between a beam lead and a first redistributed pad. Referring to FIG. 11B, contact beam leads 208b and non-contact beam leads 208c may be disposed alternately. For example, in a first row $N_1$, the contact beam lead 208b may be disposed on the left side of the first redistributed pad 142 and the non-contact beam lead 208c may be disposed on the right side of the first redistributed pad 142. In contrast, in a second row $N_2$, the contact beam lead 208b may be disposed on the right side of the first redistributed pad 142 and the non-contact beam lead 208c may be disposed on the left side of the first redistributed pad 142. This arrangement may be repeated to a $K^{th}$ column $N_k$ (k being a positive integer).

Referring to FIG. 10C, a first molding layer 150 is formed of an insulator including, for example, epoxy molding compound (EMC) to mold the first semiconductor package 100f. The first molding layer 150 may be formed in a type of exposed mold. In an exemplary embodiment, the first molding layer 150 may be formed to mold the plurality of first semiconductor chips 110 and the interposer 200f while exposing a top surface 202a of the interposer 200f. The molding layer 150 may further mold the through-hole 210. Accordingly, the contact beam lead 208b and the non-contact beam lead 208c may be exposed to the outside through the opening 209.

Referring to FIG. 10D, provided is a second semiconductor package 300f to be stacked on the first semiconductor package 100f with the interposer 200f interposed therebetween. The second semiconductor package 300f may be formed to have an identical or similar structure to the second semiconductor package 300 described with reference to FIG. 1C.

Referring to FIG. 10E, the second semiconductor package 300f is stacked on the interposer 200f to insert the solder ball 360 into the opening 209. The solder ball 360 inserted into the opening 209 is connected to the beam leads 208b and 280c. In particular, the second semiconductor package 300f is electrically connected to the interposer 200f through the solder ball 360 connected to the contact beam lead 208b. As a result, the second semiconductor package 300f may be electrically connected to the first PCB 102 via the interposer 200f. According to one exemplary embodiment, at least one of the contact beam lead 208b and non-contact beam lead 208 is electrically connected to at least one solder ball 360. For example, one solder ball 360 may be in contact with one contact beam lead 208b or one non-contact beam lead 208c.

Through the foregoing series of procedures, a Fan-in PoP type package 400f may be achieved in which the first and second semiconductor packages 100f and 300f are electrically connected to each other by mediation of the interposer 200f. Optionally, for example, a plurality of solder balls 106 may be further attached to a back side 102b of the first PCB 102 as external connection terminals.

Applicable Embodiments

Figure 12A:
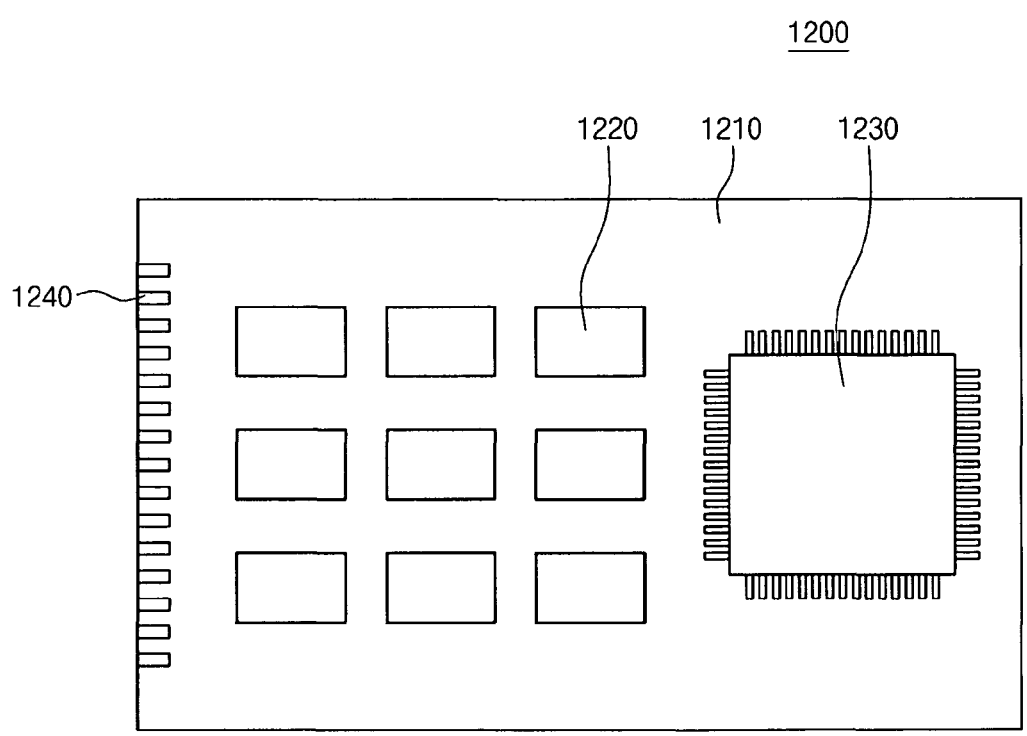
FIG. 12A is a top plan view of a package module employing a semiconductor package according to embodiments of the present invention.
Figure 12B:
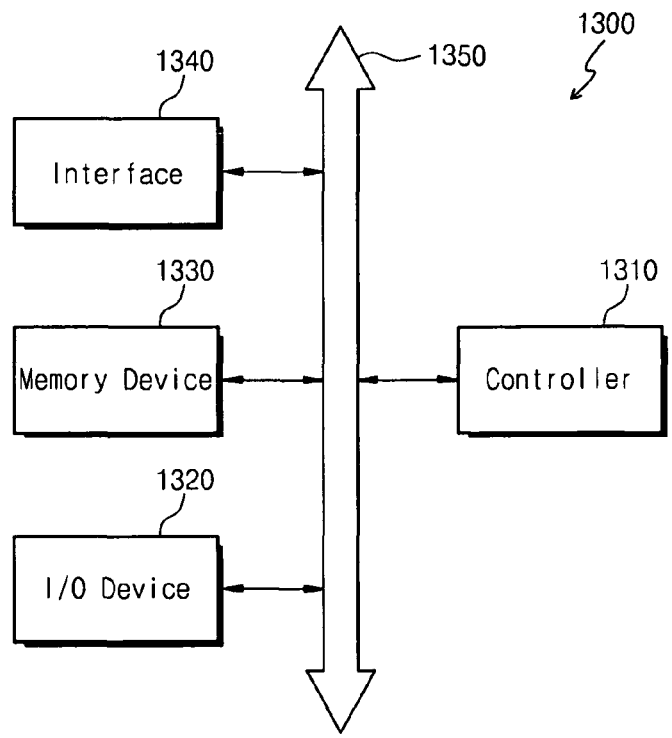
FIG. 12B is a block diagram of an electronic system employing a semiconductor package according to embodiments of the present invention.
Figure 12C:
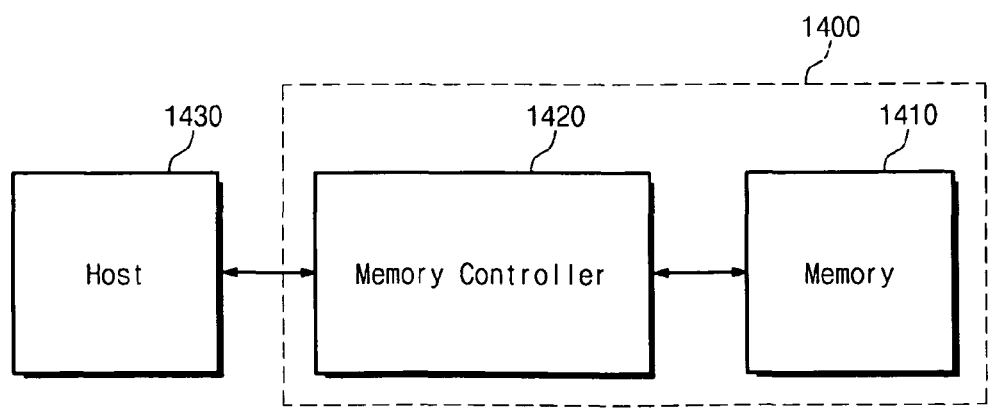
FIG. 12C is a block diagram of a memory card employing a semiconductor package according to embodiments of the present invention.

FIGS. 12A to 12C illustrate applicable embodiments of a semiconductor package according to embodiments of the present invention.

Referring to FIG. 12A, the above-described semiconductor packages 400-400f may be applied to a package module 1200 including various kinds of semiconductor devices. The package module 1200 may include a substrate 1210 with an external connection terminal 1240, a semiconductor integrated circuit (IC) chip 1220 mounted on the substrate 1210, and a semiconductor IC chip 1230 packaged in a quad flat package (QFP). The semiconductor IC chips 1220 and 1230 may be based on the package technology according to the embodiments of the present invention. The package module 1200 may be connected to an external electronic device through the external connection terminal 1240.

Referring to FIG. 12B, the above-described packages 400-400f may be applied to an electronic system 1300. The electronic system 1300 may include a controller 1310, an input/output (I/O) device 1320, and a memory device 1330, which may be connected to one another through a bus 1350 providing a data transmission path.

The controller 1310 may include at least one of at least one microprocessor, a digital signal processor, and logic devices capable of performing similar functions to the above elements. The controller 1310 and the memory device 1330 may include at least one of the semiconductor packages 400-400f according to the embodiments of the present invention. The I/O device 1320 may include at least one of a keypad, a keyboard, and a display device. The memory device 1330 may store data and/or commands executed by the controller 1310 therein.

The memory device 1330 may include a volatile memory device such as a DRAM and/or a non-volatile memory device such as a flash memory device. A flash memory device may be installed at, for example, a mobile apparatus or a data processing system such as a desktop computer. Such a flash memory device may be comprised of a solid-state drive (SSD). In this case, the electronic system 1300 may stably store high-capacity data in the flash memory device.

The electronic system 1300 may further include an interface 1340 for transmitting/receiving data to/from a communication network. The interface 1340 may be a wired interface or a wireless interface. The interface 1340 may include, for example, an antenna or a wired/wireless transceiver. The electronic system 1300 may be further provided with an application chipset, a camera image processor (CIS), and an input/output (I/O) device.

The electronic system 1300 may be fabricated as a mobile system, a personal computer (PC), an industrial computer, or a logic system performing various functions. The mobile system may be one of, for example, a personal digital assistant (PDA), a portable computer, a web tablet, a mobile phone, a wireless phone, a laptop computer, a memory card, a digital music system, and data transmission/reception system. In the case where the electronic system 1300 is an apparatus for performing wireless communication, it may be used in a communication system such as code division multiple access (CDMA), global system for mobile communication (GSM), North America digital cellular (NADC), enhanced-time division multiple access (E-TDMA), wide-band code division multiple access (WCDMA), and CDMA2000.

Referring to FIG. 12C, the above-described packages 400-400f may be provided with a type of a memory card 1400. The memory card 1400 may include, for example, a non-volatile memory device 1410 and a memory controller 1420, which may store data therein or read the stored data. The non-volatile memory device 1410 may include at least one of non-volatile memory devices manufactured based on the semiconductor package technology according to the present invention. The memory controller 1420 may control the non-volatile memory device 1410 to read stored data or store data in response to read/write request of a host 1430.

According to the present invention, yield drop resulting from chip stacking can be suppressed and fabrication costs can be reduced. Moreover, packages are stacked in a Fan-in stacking structure to reduce package warpage and form factor, as compared to a conventional fan-out stacking structure. In addition, limits in high standoff and fine ball patch design can be overcome or avoided.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A semiconductor package, comprising:
   a first package including at least one first semiconductor chip;
   a second package including an external connection terminal and at least one second semiconductor chip, the second package being stacked on the first package; and
   an interposer disposed between the first and second packages to electrically connect the first and second packages to each other,
   wherein the interposer comprises an intermediate connector having an exposed end portion to which the second package is electrically connected via the external connection terminal and a protruding end portion lower than the exposed end portion to which the first package is electrically connected, and wherein a mediation connection pad exposed through a top surface of the interposer which constitutes the exposed end portion of the intermediate connector; and
   a mediation connection lead protruding through a side surface of the interposer which constitutes the protruding end portion of the intermediate connector.

2. The semiconductor package of claim 1, further comprising a bonding layer disposed between the interposer and the first semiconductor chip to bond the interposer onto the first semiconductor chip.

3. The semiconductor package of claim 1, wherein the mediation connection lead is attached to a bonding wire for electrically connecting the interposer to the first package.

4. The semiconductor package of claim 3, wherein the first package further comprises a redistributed pad which is disposed on an edge of the first semiconductor chip to be connected to the mediation connection lead.

5. The semiconductor package of claim 1, wherein the first package further comprises a molding layer to mold the at least one first semiconductor chip and the interposer while exposing the top surface of the interposer.

* * * * *